United States Patent
Plichta et al.

(10) Patent No.: US 7,087,446 B2
(45) Date of Patent: Aug. 8, 2006

(54) METHOD OF MOUNTING OPTOELECTRONIC DEVICES ON AN OPTICAL ELEMENT AND ARTICLE

(75) Inventors: Armin Plichta, Sponheim (DE); Peter Brix, Mainz (DE); Klaus Gerstner, Mainz (DE); Dirk Schlatterbeck, Zürich (DE); Michael Weisser, Sturbridge, MA (US); Robert A. Rubino, Tolland, CT (US); Jeffrey A. Bonja, Sturbridge, MA (US); Richard Strack, Sturbridge, MA (US); Martin Sommer, Ockenheim (DE)

(73) Assignee: Schott Glas, Mainz (DE)

( * ) Notice: Subject to any disclaimer, the term of this patent is extended or adjusted under 35 U.S.C. 154(b) by 406 days.

(21) Appl. No.: 10/415,532

(22) PCT Filed: Nov. 16, 2001

(86) PCT No.: PCT/US01/43202

§ 371 (c)(1),
(2), (4) Date: Nov. 26, 2003

(87) PCT Pub. No.: WO02/063346

PCT Pub. Date: Aug. 15, 2002

(65) Prior Publication Data

US 2004/0235211 A1 Nov. 25, 2004

Related U.S. Application Data

(60) Provisional application No. 60/249,187, filed on Nov. 16, 2000, provisional application No. 60/249,188, filed on Nov. 16, 2000, and provisional application No. 60/249,198, filed on Nov. 16, 2000.

(51) Int. Cl.
*H01L 21/00* (2006.01)

(52) U.S. Cl. .................. 438/27; 438/31; 438/458; 438/464

(58) Field of Classification Search .......... 438/22–98, 438/106–127, 455–465, 977; 385/14, 120; 216/24; 257/432
See application file for complete search history.

(56) References Cited

U.S. PATENT DOCUMENTS

| | | | | |
|---|---|---|---|---|
| 5,848,214 A | * | 12/1998 | Haas et al. .................. 385/120 |
| 6,071,795 A | * | 6/2000 | Cheung et al. .............. 438/458 |
| 6,074,892 A | * | 6/2000 | Bowers et al. ................ 438/57 |
| 6,117,794 A | | 9/2000 | Dormer et al. |
| 6,137,929 A | * | 10/2000 | Rosenberg et al. ........... 385/31 |
| 6,259,846 B1 | * | 7/2001 | Roach et al. ................ 385/123 |
| 6,337,265 B1 | * | 1/2002 | Trezza et al. ................ 438/612 |
| 6,398,425 B1 | * | 6/2002 | Williams et al. .............. 385/89 |
| 6,485,993 B1 | * | 11/2002 | Trezza et al. ................. 438/22 |
| 6,674,948 B1 | * | 1/2004 | Yeh et al. .................... 385/120 |
| 6,692,979 B1 | * | 2/2004 | Yeh et al. ..................... 438/27 |
| 6,790,691 B1 | * | 9/2004 | Dudoff et al. ................ 438/28 |
| 6,790,695 B1 | * | 9/2004 | Ogihara et al. ............... 438/33 |
| 2003/0075723 A1 | * | 4/2003 | Heremans et al. ............ 257/98 |

\* cited by examiner

*Primary Examiner*—Savitri Mulpuri
(74) *Attorney, Agent, or Firm*—Volpe and Koenig, P.C.

(57) ABSTRACT

A method of mounting electro-optical devices on an optical element using an auxiliary substrate is provided herein. Electro-optical fiber optic assemblies are also described herein.

7 Claims, 1 Drawing Sheet

METHOD OF MOUNTING OPTOELECTRONIC DEVICES ON AN OPTICAL ELEMENT AND ARTICLE

This application is a 371 of PCT/US01/43202 filed Nov. 16, 2001 which claims benefit of application Ser. Nos. 60/249,187, 60/249,188 and 60/249,198 which were all filed Nov. 16, 2000.

BACKGROUND

The present invention relates to the preparation of substrates for optoelectronic devices and, more specifically, to a method of preparing an optoelectronic wafer for use with an active component. Some embodiments of the present invention are directed to fiber optic assemblies and individual components thereof which can be used in connection with optoelectronic devices.

Fiber optic technology is widely utilized in today's telecommunication and computer networks. One important aspect of fiber optic technology is the interconnection of optical fibers to optoelectronic devices, such as semiconductor lasers, photo-detectors, etc., wherein the optoelectronic devices either receive light signals from the optical fibers or the optoelectronic devices emit light signals into the fibers. A good optical interconnect between an optical fiber and an optoelectronic device requires high coupling efficiency (i.e., low loss of light from the coupling), ease of manufacture and a commercially viable manufacturing cost.

The demand for increased data transmission speed and the increase in computer processing speeds have driven the development of fiber optic technology. To achieve the necessary high density, rapid data transmission signals, optical interconnect assemblies are used in various communication and computer networks. Optoelectronic interconnects achieve higher rates of data transmission than electrical interconnects while maintaining lower power consumption.

In order to assemble high density optoelectronic interconnects, it is necessary to construct arrays of optical signal emitters and detectors which are interconnected by optical fibers. The emitters used to send the optical signals through the optical channels receive their input from electrical signals. These electrical signals can originate from an integrated circuit (IC) or the like. At the other end of the optical fibers are detectors which convert the received optical signals into electrical signals that can be processed. The connections must be extremely precise in order to avoid optical signal loss, and as the number of emitters and detectors increases, it becomes more difficult to maintain this precise alignment in constructing the connecting components. One known system of addressing this is disclosed in EP-0977064A (IMEC) in which alignment structures are formed on a faceplate. However, alignment of optic fibers with the faceplate is not addressed.

One type of light source that is used in fiber optic communication systems is the Vertical-Cavity Surface-Emitting Laser (VCSEL) which is essentially an extremely small laser (about three microns long). The VCSEL is generally constructed using two mirror stacks located on opposite sides of an active region. The mirrors reflect back and forth the light generated in the active region. This reflection back and forth results in a "stimulated emission" that produces light at a single wavelength or color. Such "coherent" emission is the hallmark of lasing technology. Conventional VCSELs in production today are typically based on a substrate of gallium arsenide. To form an array of light emitters, a semiconductor wafer consisting of multiple groups of VCSELs is typically produced. VCSELs may be top emitting or bottom emitting through the substrate, if a transparent substrate is used. Other types of light emitters, such as LEDs can also be used, if desired. Semiconductor wafers can be produced which include a large number of VCSELs grouped in precision arrays, which are then separated into individual arrays and processed and finished into optoelectronic components which must be connected to an active component in order to be able to emit optical signals.

The VCSELs are typically wire bond mounted to the active components, such as VLSI chips or the like, and an optical window is typically positioned over the VCSELs to protect them from damage as well as allow optical signal transmission from the VCSELs for communication with remainder of the optoelectronic system. However, assembly of damaged VCSELs to the active components and difficulty in positioning the VCSELs on the active components results in some of the VCSEL and active component packages being scrapped during manufacturing. Additionally, the mounting of individual optical fibers to the optical elements having a window facing the VCSEL, has been difficult to reliably accomplish in a cost effective manner. One known method is to utilize perforated alignment plates to align the fibers, as disclosed in U.S. Pat. No. 5,135,590, which is assigned to AT&T.

It would be advantageous to provide a method for VCSELs to be mounted on active components of ICs that reduces the need to scrap active components due to VCSELs being inoperative due to damage or defects incurred during formation, that simplifies the proper alignment of the VCSEL wafer with an optical element, and that allows for a better connection between the active component and the associated wafer. Additionally, it would be advantageous to provide an optical element to which an optic fiber can be readily attached. Furthermore, it would be advantageous to develop a method of mounting VCSELs to active components that is more efficient and cost effective than the prior known method.

SUMMARY

Briefly speaking, one embodiment of the present invention provides a method of mounting electro-optical devices on an optical element. The method includes: providing a semiconductor wafer having a plurality of electro-optical devices located thereon, which are adapted to emit optical signals from a first surface thereof; positioning the first surface of the semiconductor wafer in a facing orientation with an auxiliary substrate which includes a carrier material, an intermediate layer, and a transfer layer; securing the semiconductor wafer to the transfer layer of the auxiliary substrate; processing at least a portion of a second major surface of the semiconductor wafer and separating the semiconductor wafer with the attached auxiliary substrate into seperate electro-optical wafer components, each including a plurality of electro-optical devices; dissolving the intermediate layer and removing the carrier layer; and affixing the transfer layer of at least one electro-optical wafer component onto an optical element.

In another aspect, the present invention provides an electro-optical fiber optic assembly including a fiber optic faceplate having first and second surfaces and a plurality of apertures in the second surface. A layer of adhesive is disposed on the first surface of the fiber optical faceplate. A finished, processed semiconductor wafer is provided having a plurality of electro-optical devices located thereon which are adapted to emit optical signals from a first surface thereof. The first surface of the finished semiconductor wafer is disposed on the layer of adhesive in facing engagement with the first surface of the fiber optic faceplate. The electro-optical devices are aligned with the apertures in the faceplate.

In another aspect, the present invention provides a fiber optic assembly including a fiber optic faceplate having first and second surfaces. The second surface includes a plurality of apertures defined therein adapted to receive optical fibers. The apertures extend partially through the faceplate.

BRIEF DESCRIPTION OF THE DRAWINGS

The foregoing summary, as well as the following detailed description of the preferred embodiments of the present invention, will be better understood when read in conjunction with the appended drawings. For the purpose of illustrating the invention, there are shown in the drawings embodiments which are presently preferred. It should be understood, however, that the present invention is not limited to the precise arrangements and instrumentalities shown. In the drawings.

DETAILED DESCRIPTION OF THE PREFERRED EMBODIMENTS

Certain terminology is used in the following description for convenience only is not considered limiting. The terms "a" and "one" are defined as including one or more of the referenced item unless specifically noted otherwise. The term "VCSEL," as used in the specification, means "Vertical-Cavity Surface-Emitting Laser" or its equivalent. The term "electro-optical device" refers to any optical signal emitting and/or receiving device, such as a light emitting diode, a VCSEL, an optical signal detector or the like.

Figure 3:
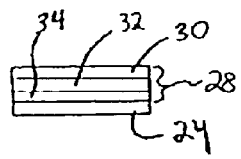
FIG. 3 is an enlarged view of one separated, finished, processed electro-optical component wafer in accordance with the present invention.
Figure 4:
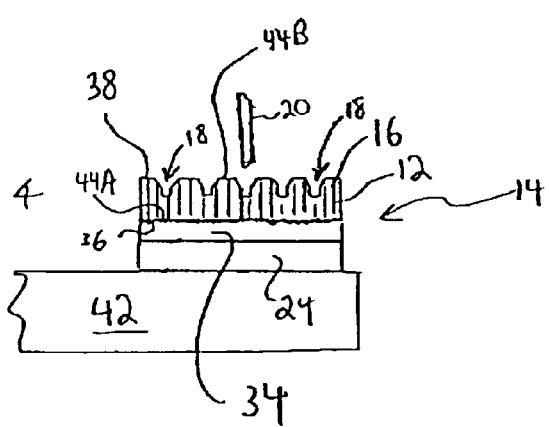
FIG. 4 is a schematic view of a fiber optic assembly attached to an active component according to the present invention.
Figure 5:
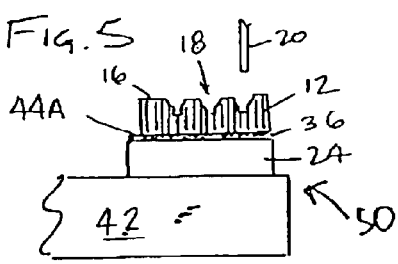
FIG. 5 is a schematic view of another embodiment of a fiber optic assembly attached to an active component.

Referring to FIGS. 1–4, a first preferred embodiment of the present invention is directed to a method of mounting a plurality of electro-optical devices 10, such as VCSELs on a finished, processed semiconductor wafer which forms an electro-optical wafer component 24, to an optical element 12. Referring to FIG. 5, a second preferred embodiment of the present invention is directed to an electro-optical fiber optic assembly 50. A third preferred embodiment of the present invention is directed to a fiber optic assembly including a fiber optic faceplate 16 having a plurality of apertures 18 defined therein and adapted to receive optical fibers 20 therein.

Figure 1:
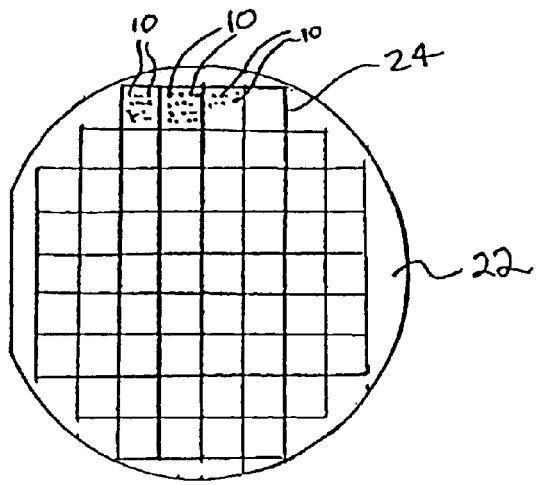
FIG. 1 is a schematic view of a semiconductor wafer having a plurality of electro-optical devices according to the present invention, shown prior to processing and finishing and separation of the wafer into separate electro-optical component wafers.

In the first preferred embodiment of the present invention, electro-optical devices 10 are mounted on an optical element 12 as follows. Referring to FIG. 1, a semiconductor wafer 22 is provided that has a plurality of electro-optical devices 10 located thereon. The electro-optical devices 10 can include optical signal emitters, optical signal detectors, or a combination of optical signal emitters and detectors which are preferably formed in groups of ordered arrays, as shown. In the preferred embodiment, the electro-optical devices 10 are VCSELs. The VCSELs may be top emitters or bottom emitters, and the emitting surface is oriented toward an optical channel, such as a fiber optic faceplate 12, upon final assembly. The electro-optical devices 10 are adapted to emit or detect optical signals from a first surface thereof which, as explained above, is oriented toward an optical channel.

Figure 2:
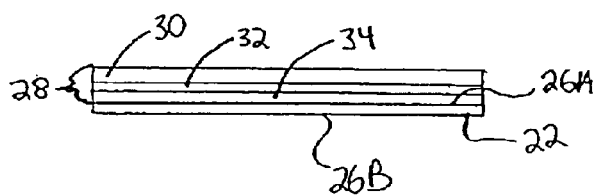
FIG. 2 is a cross-sectional view of the semiconductor wafer, with a plurality of electro-optical devices, of FIG. 1 disposed on an auxiliary substrate in accordance with the present invention.

Referring to FIG. 2, the first surface 26A of the semiconductor wafer 22 is positioned in a facing orientation with an auxiliary substrate 28. The auxiliary substrate 28 includes a carrier material 30, an intermediate layer 32, and a transfer layer 34. The carrier material 30 and the transfer layer 34 sandwich the intermediate layer 32 therebetween. The semiconductor wafer 22 is disposed in facing orientation with the transfer layer 34.

The semiconductor wafer 22 is secured to the transfer layer 34 of the auxiliary substrate 28, preferably using an optical adhesive, such as a clear epoxy or UV curable adhesive. Referring to FIG. 3, at least a portion of a second surface 26B of the semiconductor wafer 22 is processed and finished. The processing and finishing of the semiconductor wafer 22 can be completed using known etching, mechanical lapping and electrode depositing techniques, and the auxiliary substrate 28 provides firm support for easier handling as well as protection for the transmission or detection sides of the electro-optical devices 10. The semiconductor wafer 22, as well as the attached auxiliary substrate 28, is then separated into individual electro-optical wafer components 24, as shown in FIG. 4. Each of the electro-optical wafer components 24 includes a plurality of electro-optical devices 10. The wafer 28 can be separated using any known methods, such as using a wafer saw, to form electro-optical wafer components 24. The auxiliary substrate 28 provides a relatively strong base for supporting the semiconductor wafer 22 and simplifies the manipulation and processing of the semiconductor wafer 22, and protects as well as maintains the position of the electro-optical devices 10 during processing and attachment to the optical element 12.

Still with reference to FIGS. 3–4, the intermediate layer is then dissolved and the carrier layer 30 is removed. Then, the transfer layer 34 of at least one electro-optical components 24 is affixed onto an optical element 12. The electro-optical wafer component 24 is preferably secured to the optical element 12 by an adhesive layer 36 between the transfer layer 34 and the optical element 12. It is preferred that the optical element 12 is a fiber optic faceplate 16. However, those of ordinary skill in the art will appreciate from this disclosure that the optical element 12 can be any light guide, optical fiber, optical bundle, or the like without departing from the scope of the present invention.

It is preferred that the optical element 12 includes the fiber optic faceplate 16 having a surface 38 opposite from the electro-optical components 24. The surface 38 preferably includes a plurality of apertures 18 located therein in aligned positions with electro-optical devices 10. The apertures 18 are preferably adapted to receive optical fibers 20. As shown in FIG. 4, the tops of the apertures 18 preferably have a generally conical shape to facilitate the insertion of optical fibers 20 or other wave guides.

It is preferable that an active component 42 is positioned in electrical communication with the at least one electrode of the electro-optical wafer component 24 and that optical fibers 20 are secured in the apertures 18 of the fiber optic faceplate 16 such that the active component 42 can operate the electro-optical devices 10 to transmit and/or detect optical signals to and/or from the fiber optic faceplate 16 through the optical fibers 20. The active component 42 can be any one, or a combination, of CMOS technology devices, logic circuits, drivers, VLSI chips, or the like within the scope of the present invention. It is preferred that the individual electro-optical devices 10 on the electro-optical wafer component 24 are tested prior to connecting the active component 42 to the electro-optical components 24. By testing the electro-optical devices 10 on the electro-optical wafer components 24 prior to attachment to the active components 42, the loss of active components 42 during manufacturing is reduced since the active components are only connected to the electro-optical wafer components 24 when the assembly 14 is determined to be satisfactory. Due to the typically very small scale of the fiber optic assembly 14, once the fiber optic assembly 14 is attached to the active component(s) 42, it is generally not possible to try to separate the fiber optic assembly 14 from the active components 42 without damaging the active component 42. Thus, when testing of the fiber optic assembly 14 is performed after attachment of the fiber optic assembly 14 to the active component 42, any defect of the fiber optic assembly 14 results in the disposal of the fiber optic assembly 14 and the active component 42. Due to the small scale and complicated processing that is necessary to produce the fiber optic assembly 14, a number of fiber optic assemblies 14 are not suitable for connection to active components 42. Thus, by eliminating the unsatisfactory fiber optic assemblies 14 prior to attachment to active components 42, a significant savings over current manufacturing methods can be realized. This reduction in the costs created by failed fiber optic assemblies 14 resulting from avoiding the loss of associated active components 42, reduces the average manufacturing cost per acceptable fiber optic assembly 14 and active component 42 package. This allows electro-optical components 24 to be incorporated in an increasing number of electro-optical applications.

Referring to FIG. 5, the second embodiment of the present invention is directed to an electro-optical fiber optic assembly 50. The fiber optic faceplate 16, as described above, has first and second surfaces 44A, 44B and has a plurality of apertures 18 in the second surface 44B. It is preferred that a portion of each of the apertures 18 flares outwardly proximate to the second surface 44B. As detailed above, this generally conical portion facilitates the insertion of optical fibers 20 therein. It is preferred that the optical fibers 20 are secured in the apertures 18 via an adhesive. It is also preferred that the adhesive comprise an ultraviolet light activated adhesive.

A layer of adhesive 36 is disposed on the first surface of the fiber optic faceplate 44A. It is preferred that the adhesive layer 36 is an ultraviolet light (uv) activated adhesive. It is also preferred that the fiber optic faceplate 16, the layer of adhesive 36, the adhesive (which secures the optical fibers 20 within the apertures 18), and the optical fibers 20 have the same index of refraction. This reduces signal loss in transmitted or received optical signals.

A finished, processed semiconductor wafer, such as wafer component 24, having a plurality of electro-optical devices 10 located thereon that are adapted to emit and/or detect optical signals from a first surface 48 thereof is located on the layer of adhesive 36 and is properly aligned with the fiber optic faceplate 16 so that the electro-optical devices 10 (that are positioned on or in the electro-optical wafer component 24) are aligned with the apertures 18 in the faceplate 16. It is preferable that optical fibers 20 are inserted in the apertures 18 such that optical signals emitted from the electro-optical devices 10 can be transmitted through the fiber optic faceplate 16 and the optical fibers 20.

It is preferable that the electro-optical wafer component 24 is connected to an active component 42 to at least one of send or receive optical signals. As detailed above, each electro-optical wafer component 24 can include both electro-optical devices 10 that send optical signals and electro-optical devices 10 that detect optical signals.

The third preferred embodiment of the present invention is directed to a fiber optic assembly 14 as follows. The fiber optic assembly 14 includes the fiber optic faceplate 16 having first and second surfaces 44A, 44B. The second surface 44B includes a plurality of apertures 18 defined therein and adapted to receive optical fibers 20. The apertures 18 extend partially through the faceplate 16. As mentioned above, it is preferred that a portion of each of the apertures 18 flares outwardly proximate to the second surface 44B of the fiber optic faceplate 16 to facilitate the insertion of optical fibers 20 therein. While the apertures can be formed by any known method, it is preferred that the apertures 18 are formed by a photo-lithographic mask and etching process such that the location of the apertures 18 is controlled within two (2) microns or less.

Referring to FIGS. 1–4, one embodiment of the present invention is carried out as follows. A semiconductor wafer 22 is provided that has a plurality of electro-optical devices 10, such as VCSELs or the like, located thereon. The first surface of the semiconductor wafer 22 is positioned in facing orientation with an auxiliary substrate 28. The auxiliary substrate 28 provides a relatively stronger base to simplify the manipulation and processing of the semiconductor wafer 22. The semiconductor wafer 22 is secured to the transfer layer 34 of the auxiliary substrate 28. At least a portion of the second surface of the semiconductor wafer 22 is processed and finished, prior to being separated into individual (preferably miniaturized) electro-optical wafer components 24 that each include a plurality of electro-optical devices 10. The intermediate layer 32 is dissolved and the carrier material 30 is removed so that the transfer layer 34 of the at least one electro-optical component 24 can be affixed onto an optical element 12, such as a fiber optic faceplate 16, a waveguide, or the like. As mentioned above, it is preferred that the resulting fiber optic assembly 14 is tested prior to being attached to active component(s) 42. This allows defective fiber optic assemblies 14 to be disposed of and significantly reduces the cost of producing combination fiber optic assembly and active component packages.

While the preferred embodiments of the invention have been described in detail, the invention is not limited to the specific embodiments described above, which should be considered as merely exemplary. Further modifications and extensions of the present invention may be developed and all such modifications are deemed to be within the scope of the present invention as defined by the appended claims.

What is claimed is:

1. A method of mounting electro-optical devices on an optical element, comprising:
   providing a semiconductor wafer having a plurality of electro-optical devices located thereon, which are adapted to emit optical signals from a first surface thereof;

positioning the first surface of the semiconductor wafer in a facing orientation with an auxiliary substrate which includes a carrier layer, an intermediate layer, and a transfer layer;

securing the semiconductor wafer to the transfer layer of the auxiliary substrate;

processing at least a portion of a second major surface of the semiconductor wafer and separating the semiconductor wafer with the attached auxiliary substrate into individual electro-optical wafer components, each including a plurality of electro-optical devices;

dissolving the intermediate layer and removing the carrier layer; and affixing the transfer layer of at least one electro-optical wafer component onto an optical element wherein the optical element comprises a fiber optic faceplate having a surface opposite from the electro-optical wafer component, the surface including a plurality of apertures therein located in aligned positions with the electro-optic devices, the apertures being adapted to receive optical fibers.

2. The method of claim 1, wherein the step of securing the electro-optical wafer component to the optical element includes forming an adhesive layer between the transfer layer and the optical element.

3. The method of claim 1, wherein the step of processing the portion of the semiconductor wafer includes using a mechanical lapping process to remove part of the semiconductor material.

4. The method of claim 1, wherein the step of processing the portion of the semiconductor wafer includes using an etching process to remove part of the semiconductor material.

5. The method of claim 1, wherein the step of processing the portion of the semiconductor wafer includes depositing electrodes on the semiconductor material.

6. The method of claim 1, further including positioning an active component in communication with the at least one electrode of the electro-optical wafer component and securing optical fibers in the apertures of the fiber optic faceplate such that the active component can operate the electro-optical wafer component to transmit optical signals through the fiber optic faceplate and through the optical fibers.

7. The method of claim 6, further including testing the electro-optical devices on the electro-optical wafer component prior to connecting the active component and the electro-optical wafer component together.

* * * * *